United States Patent [19]

Shoemaker

[11] Patent Number: 4,978,873
[45] Date of Patent: Dec. 18, 1990

[54] CMOS ANALOG FOUR-QUADRANT MULTIPLIER

[75] Inventor: Patrick A. Shoemaker, Lemon Grove, Calif.

[73] Assignee: The United States of America as represented by the Secretary of the Navy, Washington, D.C.

[21] Appl. No.: 421,495

[22] Filed: Oct. 11, 1989

[51] Int. Cl.$^5$ .................. H03L 5/00; H03K 19/01
[52] U.S. Cl. ..................... 307/498; 307/201; 328/160; 364/841
[58] Field of Search ............ 307/501, 498, 490; 364/841

[56] References Cited

U.S. PATENT DOCUMENTS

| | | | |
|---|---|---|---|
| 4,101,966 | 7/1978 | Uzunoglu | 307/501 |
| 4,156,924 | 5/1979 | Lampe et al. | 307/498 |
| 4,387,439 | 6/1983 | Lin | 307/498 |
| 4,835,421 | 5/1989 | Khoury et al. | 307/501 |
| 4,906,873 | 3/1990 | Shoemaker et al. | 307/498 |

Primary Examiner—Stanley D. Miller
Assistant Examiner—Toan V. Tran
Attorney, Agent, or Firm—Harvey Fendelman; Thomas Glenn Keough; Michael A. Kagan

[57] ABSTRACT

A four-quadrant analog multiplier circuit provides an output which is proportional to two voltage inputs that each represent a multiplicand. In a first embodiment, the circuit comprises a complementary pair of field effect transistors having gain constants equal in magnitude and in which the p-channel threshold voltage is larger than the n-channel threshold voltage. The gates of the transistors are coupled in common. One input is added to a bias voltage and the voltage sum is applied to the common gates. The other input and its inverse are separately applied to source/drain terminals of the two transistors, while the remaining source/drain terminals are coupled in common to provide an output node. A second embodiment of the invention is composed of two circuits as described above, where the polarities of the inputs to one pair of transistors are reversed relative to those of the second pair, and the output nodes of the individual pairs are coupled together.

20 Claims, 8 Drawing Sheets

CMOS ANALOG FOUR-QUADRANT MULTIPLIER

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention relates to the field of multiplier circuits, and more particularly, to the field of four-quadrant analog multiplier circuits.

Analog multiplier circuits form important building blocks for devices such as adaptive filters, function generators, and modulators. In the emerging field of artificial neural networks, implementation of useful network structures in analog integrated circuitry will in many cases require large arrays of multiplier Some designs for analog four-quadrant multiplication MOS circuitry existing to date are based upon the characteristics of MOS transistors in saturation. See Soo, D. C., and Meyer, R. G., "A Four-Quadrant NMOS Analog Multiplier," IEEE J. Solid-State Circuits, vol. SC-17, pages 1174-1178, December 1982; and Bult, K., and Wallinga, H., "A CMOS Four-Quadrant Analog Multiplier", *IEEE J. Solid-State Circuits*, vol. SC-21, pages 430-435, June 1986. However, these circuits typically require twenty to forty transistors to provide a practical working circuit. Another type of four-quadrant multiplier circuit is taught in U.S. Pat. No. 4,071,777, "Four-Quadrant Multiplier" by Herrmann, Jan. 31, 1978. Herrmann's basic circuit includes two enhancement mode transistors and requires separate DC bias voltages applied to each of two transistor gates as well as voltage inputs representing the multiplicands, resulting in a complicated circuit.

Still another four-quadrant multiplier circuit is taught by Enomoto, J., et al., "Integrated MOS Four-Quadrant Analog Multiplier Using Switched Capacitor Technology For Analog Signal Processor IC's,"*IEEE Journal of Solid-State Circuits*, Vol. SC20, No. 4, August 1985. Enomoto teaches the use of two depletion mode transistors biased in the linear or triode region in combination with a difference amplifier to perform four-quadrant multiplication. However, this device disadvantageously requires circuitry to compute the difference in currents flowing through the two transistors.

Therefore, a need exists for a four-quadrant multiplier having a minimal number of transistors and which does not require application of different bias voltages to each transistor gate or inclusion of amplifiers within the circuit.

SUMMARY OF THE INVENTION

The invention provides a simple electical circuit that accomplishes four-quadrant multiplication of two values represented by input voltages, $V_1$ and $V_2$, which are applied to the transistors. The ouput of the circuit is proportional to the product ($V_1V_2$). The simplified circuit makes the invention suitable for use in large arrays expected to be found in artificial neural networks.

A first embodiment of the invention includes a complementary pair of n- and p- channel transistors. The respective threshold voltages $V_{tn}$ and $V_{tp}$ of the n- and p-channel transistors satisfy the relation: $V_{tp}-V_{tn}>0$. The gates of the two transistors are connected in common and receive a voltage which is the sum of input $V_1$ and a bias voltage $V_b$, where $V_b=(V_{tp}+V_{tn})/2$. Second voltage input $V_2$ and its inverse $-V_2$ are also provided to the circuit. In the case where $V_2>0$, $V_2$ is provided to the terminal of the n-channel transistor which acts as the drain and $-V_2$ is provided to the terminal of the p-channel transistor which acts as the drain. The terminals of each transistor which act as sources are connected at an output node. In the case where $V_2 0$, then $V_2$ and $-V_2$ are applied to the same physical terminals as in the first case, however, these two terminals become the sources of the two transistors due to the difference in polarity of the applied voltages from those of the first case. In the latter case, the two terminals which are connected at the output node become the drains of the two transistors. In either case, the circuit provides an output proportional to the product ($V_1V_2$).

A second embodiment of the present invention is an electrical circuit that includes two pairs of complementary MOS transistors, where each pair is configured similarly to the circuit of the first embodiment, except that the inputs $V_1$, $V_2$, and $-V_2$ are replaced by their inverses $-VI$, $-V_2$, and $V_2$, respectively, on one of the two pairs. The output nodes of the individual transistor pairs are connected in common. The bias voltage used in this circuit may deviate significantly from the ideal value $V_b$, as the error which such a deviation would cause in the first embodiment is canceled in the second. In addition, other errors due to mismatched gain constant magnitudes and second-order effects are reduced by the second embodiment.

OBJECTS OF THE INVENTION

A first object of the present invention is to provide a four-quadrant analog multiplier requiring five or fewer terminals.

A second object of the present invention is to provide a four-quadrant analog multiplier suitable for use in arrays.

A third object of the present invention is to provide a four-quadrant analog multiplier which outputs a current proportional to two input voltages.

A fourth object of the present invention is to provide a four-quadrant analog multiplier which outputs a voltage proportional to two input voltages.

A fifth object of the present invention is to provide a four-quadrant analog multiplier which does not require CMOS transistors with depletion mode thresholds which are closely matched in magnitude.

DESCRIPTION OF THE PREFERRED EMBODIMENT

Figure 1:
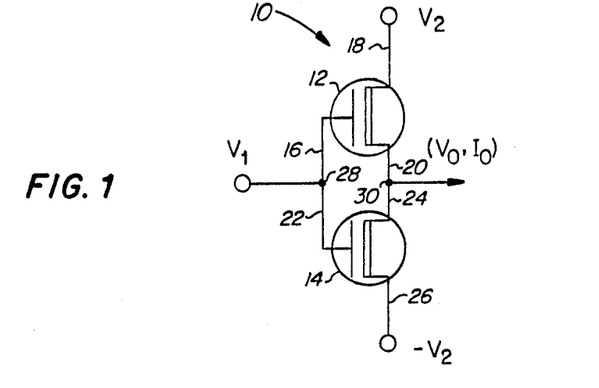
FIG. 1 is a schematic diagram of a four-quadrant analog multiplier circuit.

Referring to the drawings wherein like reference numerals designate like or similar parts throughout the several views, FIG. 1 depicts a schematic diagram of multiplier circuit 10, having a pair of complementary depletion-mode MOS transistors, 12 and 14. N-channel transistor 12 includes gate 16, terminal 18, and terminal 20. P-channel transistor 14 includes gate 22, terminal 24 and terminal 26. Gate 16 is connected to gate 22 at node 28. Terminal 20 is connected to terminal 24 at output node 30.

In multiplier circuit 10, the substrates (not shown) of transistors 12 and 14 are either electrically isolated, or biased in such a way as to insure reverse-bias across p-n junctions under all operating conditions by techniques well known to those of ordinary skill who practice this technology. A voltage $V_1$ is applied to gates 16 and 22 through node 28. A second voltage $V_2$ is applied to terminal 18 of transistor 12 (n-channel). Voltages $V_1$ and $V_2$ are measured with respect to a reference voltage, which may commonly be referred to as ground, as are all other voltages described hereinafter. The inverse of voltage $V_2$, i.e., $-V_2$, is applied to terminal 26 of transistor 14 (p-channel).

Operation of multiplier circuit 10 assumes transistors 12 and 14 follow the first order approximation for drain current through a MOSFET presented below:

$$I_d = \mu C_{ox} W/L[(V_{gs} - V_t)V_{ds} - \tfrac{1}{2}V_{ds}^2] \tag{1}$$

where $I_d$ is the drain current (taken as positive into the drain), $V_{gs}$ is the gate-to-source voltage, $V_{ds}$ is the drain-to-source voltage, $V_t$ is the threshold voltage, $\mu$ is the channel mobility, $C_{ox}$ is the capacitance per unit area across the gate oxide of the transistor, and W and L are the width and length, respectively, of the channel of the transistor.

Figure 2:
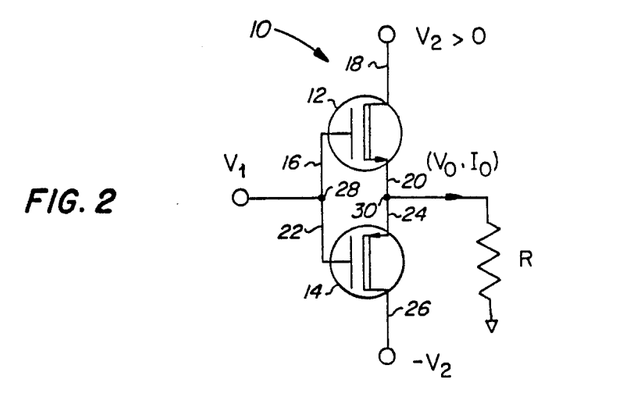
FIG. 2 is a schematic diagram of the present invention in operation where $V_2>0$.

The respective gain constants, $K_n$ and $K_p$, for n-channel transistor 12 and p-channel transistor 14, each representing the expression $\mu C_{ox}W/L$ for the respective transistor, are assumed to be matched in magnitude where:

$$-K_n = K_p = K, \tag{2}$$

where $K > 0$, and the respective depletion-mode threshold voltages $V_{tn}$ and $V_{tp}$ are assumed to be likewise matched where:

$$-V_{tn} = V_{tp} = V_T, \tag{3}$$

and where $V_T > 0$, the subscripts n and p represent n-channel and p-channel transistors 12 and 14, respectively, and $V_T$ represents the design threshold voltage magnitude of transistors 12 and 14. Operation of multiplier circuit 10 for the case in which $V_2 > 0$ is illustrated in FIG. 2. Substitution of the voltages $V_1$, $V_2$, and $-V_2$, indicated in FIG. 1, and of the parameters K and $V_T$, defined in equations 2 and 3, into Eqn. (1) yields the following expressions for the drain currents $I_{dn}$ and $I_{dp}$ of n- and p- channel transistors 12 and 14, respectively:

$$(4.1)\ I_{dn} = K[(V_1 - V_o V_T)(V_2 - V_o) - (V_2 - V_o)^2] \tag{4.1}$$

$$I_{dp} = -K[(V_1 - V_o V_T)(-V_2 - V_o) - \tfrac{1}{2}(-V_2 - V_o)^2] \tag{4.2}$$

The output current is expressed as:

$$I_o = I_{dn} + I_{dp}, \tag{4.3}$$

which upon substitution of the expressions for $I_{dn}$ and $I_{dp}$ of Eqns. (4.1) and (4.2) into Eqn. (4.3), and solving for $I_o$ yields:

$$I_o = 2K(V_1 V_T V_o). \tag{5}$$

Figure 3:
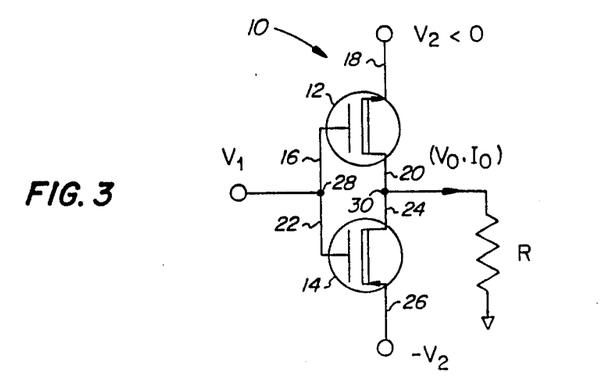
FIG. 3 is a schematic diagram of the present invention in operation where $V_2<0$.

The case for $V_2 < 0$ is illustrated in FIG. 3. The giving the currents flowing through transistors 12 and 14 become:

$$I_{dn} = K[(V_1 V_2 + V_T)(V_o - V_2) - \tfrac{1}{2}(V_o - V_2)^2] \tag{6.1}$$

$$I_{dp} = -K[(V_1 + V_2 - V_T)(V_o + V_2) - \tfrac{1}{2}(V_o V_2)^2]. \tag{6.2}$$

In this case:

$$I_o = -(I_{dn} + I_{dp}), \tag{6.3}$$

whereby substituting the expressions for $I_{dn}$ and $I_{dp}$ of Eqns. (6.1) and (6.2) into Eqn. (6.3) yields Eqn. (5) for the output current, $I_o$, thus demonstrating four quadrant operation of multiplier circuit 10.

Figure 4:
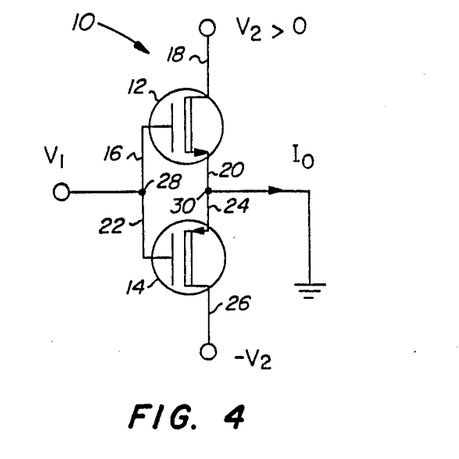
FIG. 4 is a schematic diagram of the present invention operating in a short-circuit output to ground mode.

In the case of short-circuit output to ground depicted in FIG. 4, the output current can be expressed as:

$$I_o = 2KV_1V_2 \text{ (short circuit output current)} \tag{7}$$

Figure 5:
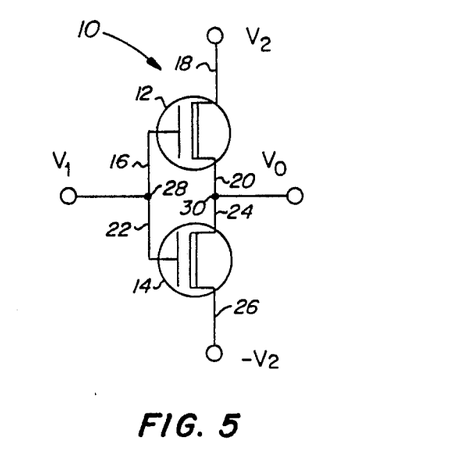
FIG. 5 is a schematic diagram of the present invention operating in an open circuit mode.

In the case of open-circuit output depicted in FIG. 5, the output voltage, $V_o$, may be expressed as:

$$V_o = (1/V_T)V_1V_2 \text{ (open circuit output voltage).} \tag{8}$$

Equation (8) applies when multiplier circuit 10 drives a high-impedance load.

When a linear resistive load, R, is placed between the output and ground, as shown in FIG.'s 2 or 3, the output current $I_o$ becomes:

$$I_o = [2K/(1+2KV_TR)]V_1V_2 \text{ (linear resistive load to ground).} \tag{9}$$

The following conditions must be satisfied to assure that transistors 12 and 14 operate within their respective triode regions:

$$V_{gs} - V_{tn}V_{ds} \text{ (n-channel device)} \tag{10.1}$$

$$V_{gs} - V_{tp} > V_{ds} \text{ (p-channel device),} \tag{10.2}$$

and $$V_{gs} - V_{tn} > 0 \text{ (n-channel device)} \tag{10.3}$$

$$V_{gs} - V_{tp} > 0 \text{ (p-channel device)}. \tag{10.4}$$

These inequalities define regions of the input space in which it is permissible to operate. It can be shown that the restriction:

$$|V_1| + V_2| > V_T$$

defines a locus of input voltages which is a subset of the permissible operating regions under any of the output conditions of (7), (8), or (9), and thus it is a sufficient condition to impose upon the input ranges for proper operation of the multiplier.

Referring to FIG.'s 1–5 collectively, circuit 10 ideally should be constructed with gain constants $K_n$ and $K_p$ of transistors 12 and 14, respectively, being matched in magnitude, and with threshold voltages $V_{tn}$ and $V_{tp}$, of transistors 12 and 14, respectively, being matched in magnitude. Techniques for varying gain constants and threshold voltages of transistors are well known by those skilled in this art. However, close matching is difficult to achieve, particularly for the threshold voltages. Therefore, the scope of the invention comprehends a circuit composed of two complementary MOS transistors with significantly different threshold voltage magnitudes.

Figure 18:
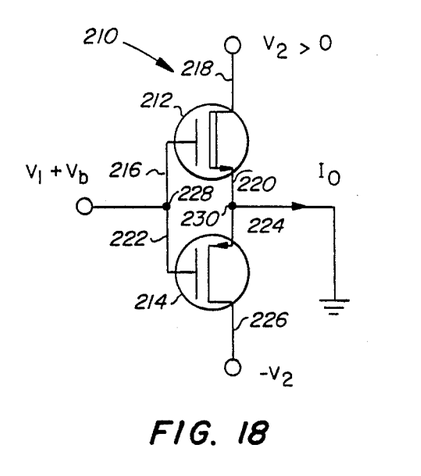
FIG. 18 is a schematic diagram of a four-quadrant multiplier circuit in a short-circuit output to ground mode.

Referring to FIG. 18, there is depicted a schematic diagram of multiplier circuit 210, comprising MOS transistors, 212 and 214. N-channel transistor 212 includes gate 216, terminal 218, and terminal 220. P-channel transistor 214 includes gate 222, terminal 224 and terminal 226. Gate 216 is connected to gate 222 at node 228. Terminal 220 is connected to terminal 224 at output node 230. FIG. 18 illustrates multiplier circuit 210 as including n- channel transistor 212 implemented as a depletion mode device and p- channel transistor 214 implemented as a enhancement mode device. However, multiplier circuit 210 may also be implemented where n-channel transistor 212 is an enhancement mode- device and p- channel transistor 214 is a depletion mode device; or transistors 212 and 214 may both be depletion mode devices.

In order to function as a multiplier, the voltage difference, Vd, between the threshold voltage $V_{tp}$ of p- channel transistor 214, and the threshold voltage $V_{tn}$ of n- channel transistor 212, must satisfy the relation:

$$V_d = V_{tp} - V_{tn} > 0. \tag{12}$$

Additionally, the respective gain constants $K_n$ for n-channel transistor 212, and $K_p$ for p-channel transistor 214, which each represent the expression $\mu C_{ox} W/L$ for the respective transistor, are assumed to be substantially matched in magnitude per Equation (2).

In the operation of multiplier circuit 210, where the values to be multiplied are represented by the voltages $V_1$ and $V_2$, voltage $V_2$ is applied to terminal 218 and its inverse, $-V_2$, is applied to terminal 226. The sum of voltage $V_1$ and a bias voltage Vb is applied to the common gate of transistors 212 and 214 at node 228, where:

$$V_b = (V_{tp} + V_{tn})/2. \tag{13}$$

As before, both devices must remain in the linear or triode region of operation for all of the above output conditions for the circuit to behave as a multiplier, and the restriction:

$$|V_1| + |V_2| < V_d/2 \tag{14}$$

is sufficient to insure this.

Figure 19:
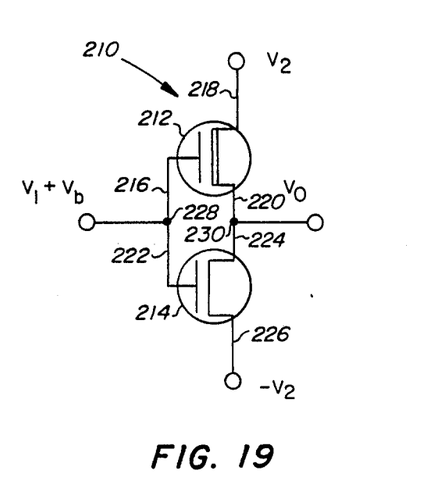
FIG. 19 is a schematic diagram of a four-quadrant multiplier circuit in an open circuit output mode.

While FIG. 18 depicts multiplier circuit 210 operating in a short-circuit output to ground mode, multiplier circuit 210 can be operated in an open circuit output mode as shown in FIG. 19, and can also be operated with a linear resistive load placed between the output and ground.

Although multiplier circuit 210 allows operation with significantly mismatched threshold voltage magnitudes by addition of bias voltage $V_b$, mismatches between the magnitudes of gain constants $K_n$ and $K_p$ will result in deviations from Equation (5). In addition, errors in the bias voltage $V_b$, and deviations from the first-order MOSFET characteristics of Equation (1) will result in further errors in the circuit output. Certain of these multiplication errors can be reduced by a second embodiment of the present invention, circuit 100, schematically illustrated in FIG. 6., described below.

Figure 6:
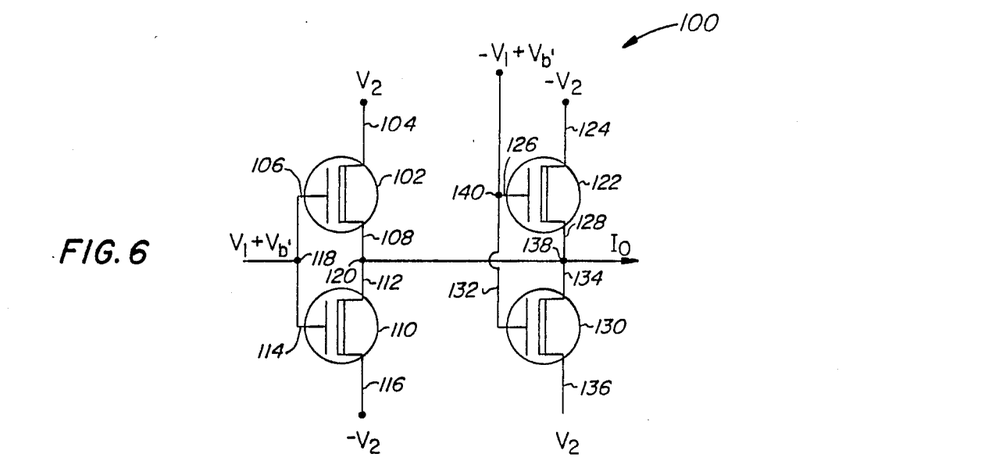
FIG. 6 is a second embodiment of the present invention which eliminates output errors attributable to mismatches in threshold voltages between the n- and p-channel transistors.

N-channel transistor 102 having terminal 104, gate 106 and terminal 108 is operably coupled to p-channel transistor 110 having terminal 112, gate 114, and terminal 116. Gates 106 and 114 are operably coupled at node 118. Terminal 108 is connected to terminal 112 at node 120. Circuit 100 includes second n-channel transistor 122 having terminal 124, gate 126, and terminal 128; and second p-channel transistor 130 having gate 132, terminal 134, and terminal 136. Terminal 128 is operably coupled to terminal 134 at node 138. Gate 132 is operably coupled to gate 126 at node 140. Node 120 is operably coupled to node 138.

The transistor parameters of n-channel transistors 102 and 122 are assumed to be matched; that is, both have threshold voltages substantially equal to $V_{tn}$, and gain constants substantially equal to $K_n$. Similarly, the transistor parameters of p-channel transistors 110 and 130 are assumed to be matched; that is, both have threshold voltages substantially equal to $V_{tp}$, and gain constants substantially equal to $K_p$. The threshold voltages $V_{tn}$ and $V_{tp}$ are assumed to satisfy the inequality (12).

In the operation of circuit 100, $V_2$ is applied to terminals 104 and 136, and $-V_2$ is applied to terminals 116 and 124. A bias voltage Vb which may assume any value in the range $$V_{tn} < V_b' < V_{tp} \tag{15}$$

is added to $V_1$ and the sum is applied to node 118. In addition, $V_b'$ added to a voltage input $-V_1$ and the sum is applied to node 140. This circuit cancels the effects of deviations of the bias $V_b'$ from the ideal value Vb given in Equation (13). However, when $V_b'$ is not equal to $V_b$, the permissible operating range of the circuit in input space is reduced. Just as both transistors in the circuit 10 were required to operate in their triode regions, all four transistors in circuit 100 are required to operate in their triode regions, and if $V_b'$ is not equal to $V_b$, then the relation represented by Equation (14) is no longer a sufficient condition to insure this.

If all transistors in circuit 100 are depletion mode, then the condition represented by Equation (15) is satisfied when the bias voltage is identically zero, and such a circuit may be operated without the necessity of computing and imposing a bias, in addition to the inputs $V_1$ and $-V_1$, on the gates of the two pairs of complementary transistors.

In addition to eliminating the effects of deviation of the bias voltage from the ideal value $V_b$, circuit 100 eliminates output error terms which are of odd order in the inputs $V_1$ and $V_2$, due to its symmetry with respect to a simultaneous change of signs of both $V_1$ and $V_2$. In this way, error due to mismatched gain constant magnitudes and to certain second-order effects which are deviations from Equation (1), such as the body effect, is reduced.

Figure 6A:
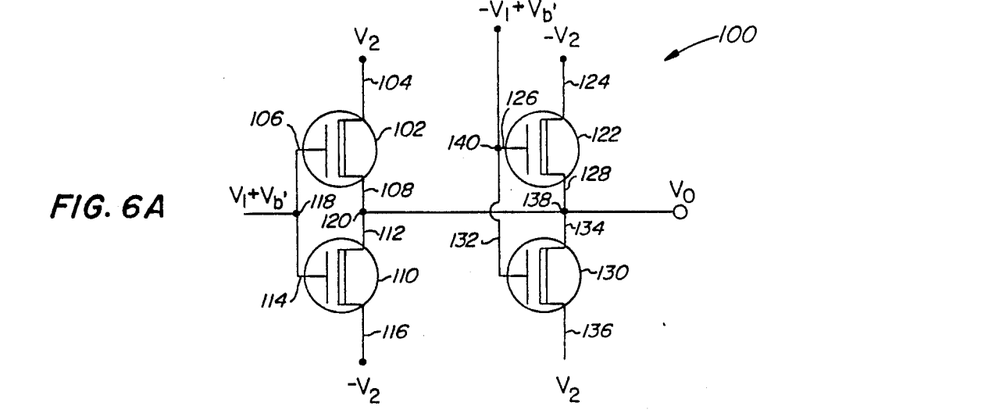
Figure 6B:
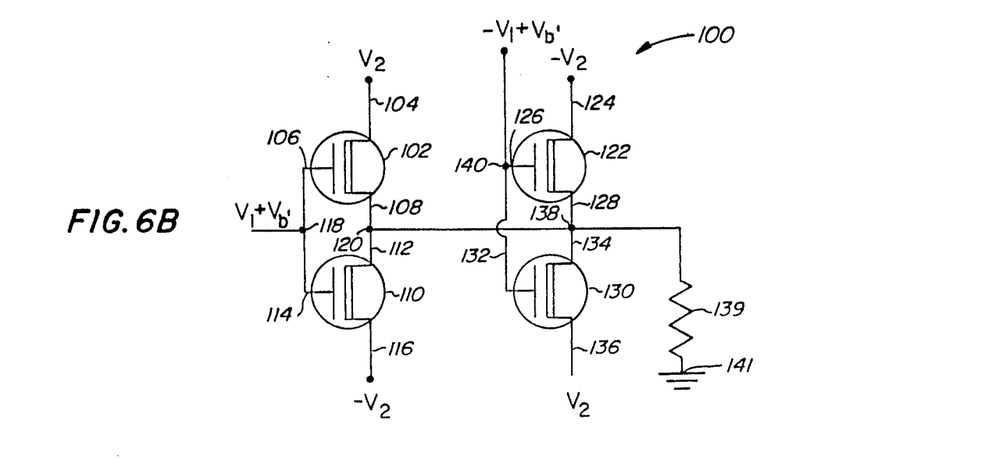

As was the case for the circuit 210, the output of circuit 100 may be detected as a voltage, $V_o$, or as a current, $I_o$. For example, output voltage Vo may be detected where the invention is operated in an open circuit mode, as depicted in FIG. 6A. The output of circuit 100 may be detected as current $I_o$ or voltage $V_o$ where circuit 100 is operated with linear resistive load 139 electrically coupled between node 138 and ground 141, as depicted in FIG. 6B. The output may also be detected as a current where the circuit is operated with short-circuit output to ground.

CONSTRUCTION OF THE INVENTION

Construction of four-quadrant analog multiplier circuit 10 may be accomplished through standard deposition, implant, and photolithographic techniques as described below by way of example and as illustrated in FIG.'s 7-17, inclusive. These techniques may also be employed to construct circuit 100. For ease of reference, the assembly which is subjected to the manufacturing steps described below and which results in a completed circuit 10 is referred to as wafer 49.

Figure 7:
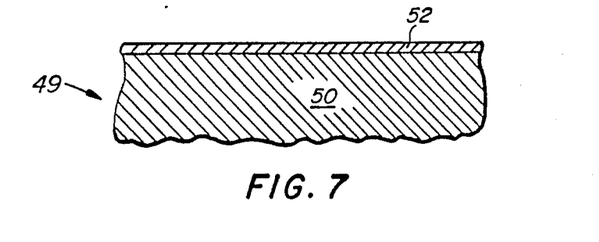
FIG. 7 depicts a thin film of semiconductor material deposited on an insulating substrate.

Referring to FIG. 7, the present invention is formed on insulating substrate 50 having a thin layer of semiconductor material 52 deposited thereon. The structure comprising semiconductor material 52 deposited on substrate 50 is available commercially and may be, for example, silicon on sapphire, as is well known by those skilled in this technology. In the preferred embodiment of the present invention, semiconductor material 52 is a 300 nanometer layer of silicon film.

Figure 8:
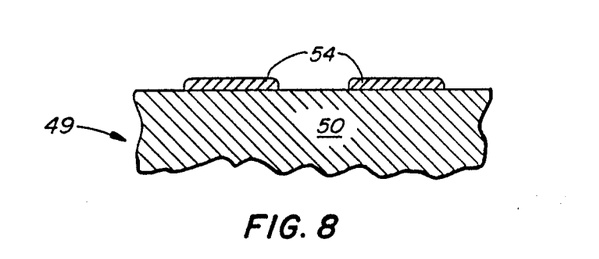
FIG. 8 depicts semiconductors islands formed on the insulating substrate.
Figure 9:
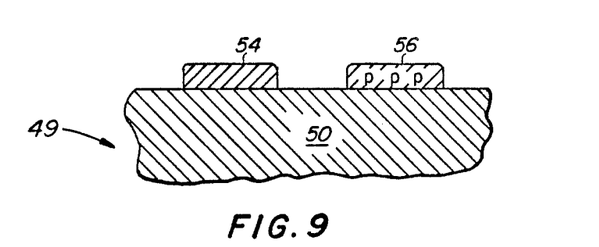
FIG. 9 depicts an island doped with p-type dopant.
Figure 10:
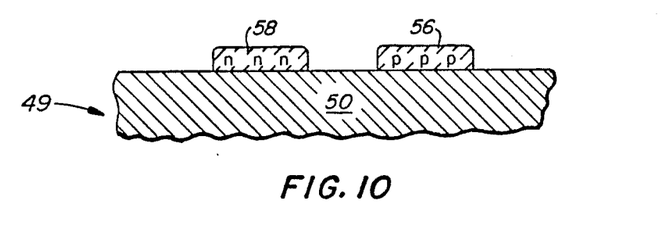
FIG. 10 depicts an island doped with n-type dopant.

Referring to FIG. 8, semiconductor material 52 is etched through standard photolithographic techniques to produce semiconductor islands 54. The process of doping these semiconductor islands to be described below will generally result in formation of p-channel and n-channel transistors which are depletion-mode. However, it is to be understood that, by varying the type and amount of dopant, complementary transistors of which one type is enhancement mode and one type depletion mode may be constructed using techniques similar to those described below as would be well known to those of ordinary skill in the art. Those islands 54 which are to become n-channel transistors are masked. Doped region 56 of p-type material is formed in semiconductor islands 54 as shown in FIG. 9. This may be accomplished by masking islands 54 which are to doped with n-type dopant and subjecting remaining islands 54 to ion implantation with p-type dopant such as boron. Islands 54 and 56 next are oxidized to a depth that assures an approximately 100 nanometer thick layer of unoxidized silicon is present at the end of the process. Islands 56 are masked and those islands 54 which are not doped with p-type dopant then are implanted with n-type dopant such as arsenic to create n-type implanted islands 58 as shown in FIG. 10.

Figure 11:
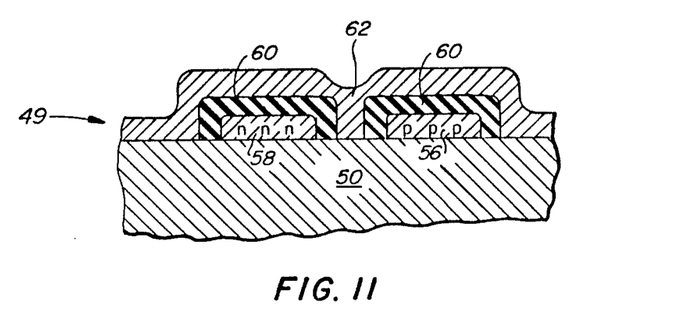
FIG. 11 illustrates a layer of oxide and a coating of polysilicon formed over the wafer.
Figure 12:
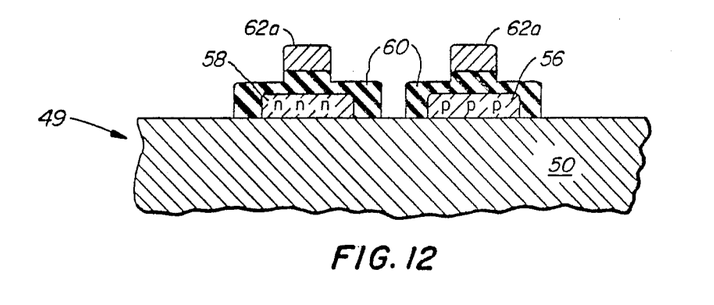

Referring to FIG. 11, a layer of gate oxide 60 is formed over islands 58 and 56 by oxidation. A coating of polysilicon 62 is placed over wafer 49. Polysilicon coating 62 and gate oxide 60 are then selectively etched through photolithographic techniques to create self-aligning polysilicon gates 62a as shown in FIG. 12. However, in the preferred embodiment of wafer 49, a layer of gate oxide 60 approximately 50 nanometers thick is left remaining over islands 56 and 58.

Figure 13:
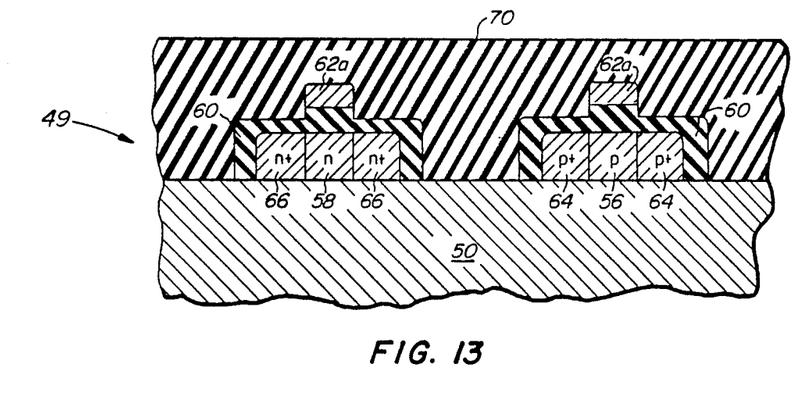
FIG. 13 illustrates coating of field oxide formed over the wafer.
Figure 14:
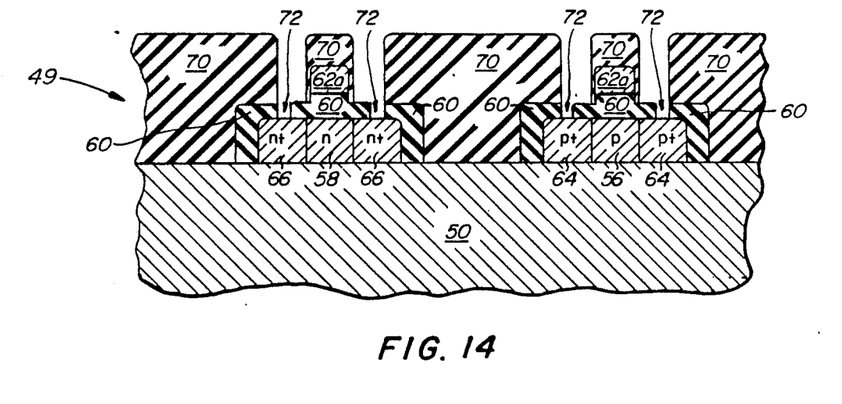
FIG. 14 illustrates the after effects of selective removal of the field oxide layer.
Figure 15:
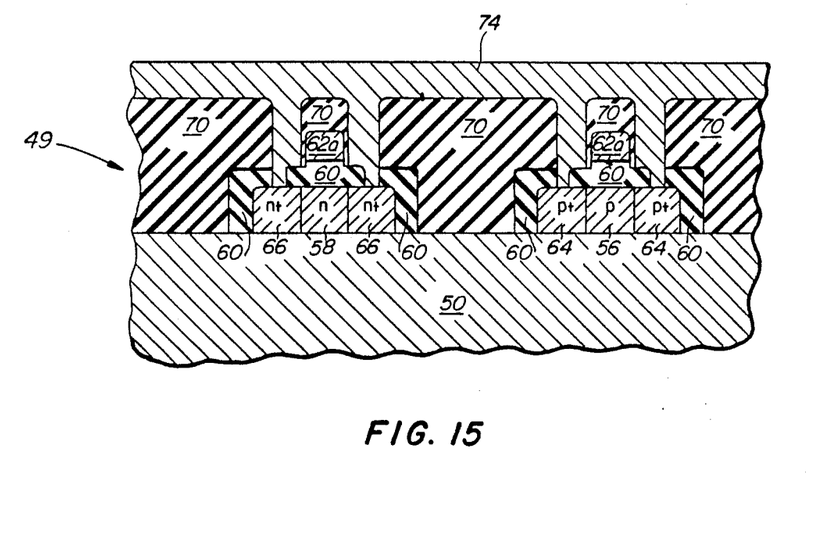
FIG. 15 illustrates a metallization layer formed over the wafer.
Figure 16:
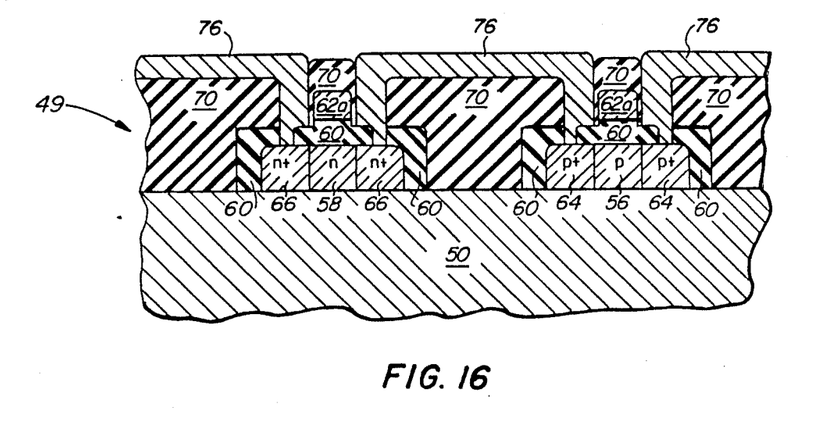
FIG. 16 illustrates a cross-sectional view of the wafer taken along line 16—16 of FIG. 17.
Figure 17:
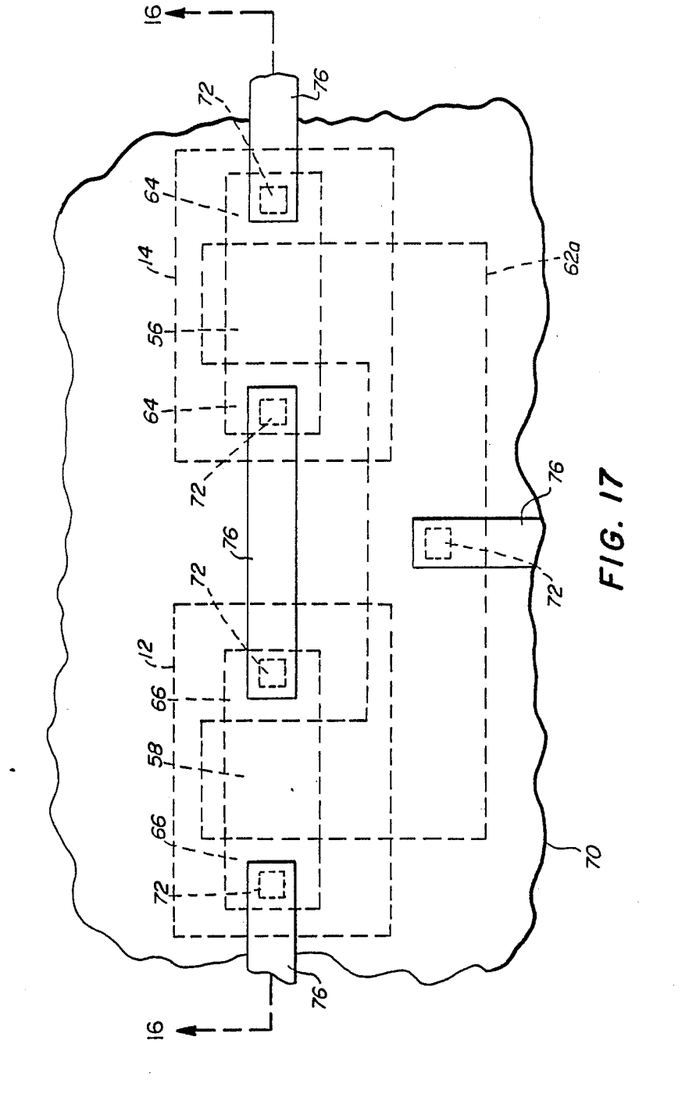
FIG. 17 illustrates a plan view of the wafer.

Still referring to FIG. 12, regions 58 are masked. P-type material, such as boron, is implanted through gate oxide 60 on into p-doped islands 56 to create heavily doped p+ source and drain regions 64. Regions 56 are masked. N-type dopant such as arsenic is implanted through gate oxide 60 into n-doped islands 58 to create heavily doped n+ source and drain regions 66. FIG. 13 depicts a coating of field oxide 70, such as silicon dioxide, formed over wafer 49 by deposition. As shown in FIG.'s 14 and 17, selected regions of field oxide 70 and of gate oxide 60 then are etched to create contact holes 72 which provide access to p+ and n+ regions 64 and 66, respectively, and with polysilicon gates 62a. Metallization layer 74 is formed over wafer 49 and fills contact holes 72, as shown in FIG. 15. Although several conductive metals may be used, metallization layer 74 is preferably formed of aluminum. Regions of metallization layer 74 then are etched away through photolithographic techniques to create metal interconnections 76 as depicted in FIG. 16. A plan view of wafer 49, including transistors 12 and 14 is illustrated in FIG. 17. Optionally, a passivation layer (not shown) may be deposited over wafer 49, except where selected areas of metallization layer 74 are to be in contact with the external world, to protect the underlying circuitry from deterioration from exposure to environmental effects.

The above-referenced process steps have been described to facilitate an understanding of the manufacture of circuit 10. However, it is to be understood that these process steps may be used to create arrays comprising any number of circuits 10 or 100. The individual process steps described above employ techniques well known to those skilled in this technology and are presented by way of example only. It is to be understood that the scope of the invention is not limited to being manufactured by the processes described herein. The invention may be manufactured by other processes as well.

Obviously, many modifications and variations of the present invention are possible in light of the above teachings. It is therefore to be understood that within the scope of the appended claims, the invention may be practiced otherwise than as specifically described.

I claim:

1. A four quadrant multiplier circuit for providing an output which is proportional to a multiplication product of input voltages $V_1$ and $V_2$, comprising:

an n-channel field effect transistor having a first gate, first and second terminals, threshold voltage $V_{tn}$, and a gain constant $K_n$; and a p-channel field effect transistor having a second gate, third and fourth terminals, threshold voltage $V_{tp}$, where $V_{tp} - V_{tn} > 0$, and a gain constant $K_p$ substantially equal to $K_n$; where said input voltage $V_2$ is applied to said first terminal and an input voltage $-V_2$ is applied to said fourth terminal, such that when said input $V_2 > 0$, said second and third terminals are sources of said n- and p- channel transistors and said first and fourth terminals are drains of said n- and p- channel transistors; and when said input $V_2<0$, said second and third terminals are drains of said n- and p-channel transistors, and said first and fourth terminals are sources of said n- and p-channel transistors;

said first and second gates are electrically coupled in common to form a common gate, said common gate receiving a voltage which is the sum of said input voltage $V_1$ and a bias voltage, $V_b$, where $V_b$ is substantially equal to $(V_{tp}+V_{tn})/2$;

said second terminal is electrically coupled to said third terminal to provide an output terminal; and $|V_1|$ and $|V_2|$ are limited such that said n- and p-channel transistors are operated in their respective triode regions.

2. The circuit of claim 1 wherein:
said n- channel transistor is a depletion mode transistor; and
said p- channel transistor is an enhancement mode transistor.

3. The circuit of claim 1 wherein:
said n- channel transistor is an enhancement mode transistor; and
said p- channel transistor is a depletion mode transistor.

4. The circuit of claim 1 wherein:
said n- channel transistor is a depletion mode transistor; and
said p- channel transistor is a depletion mode transistor.

5. The circuit of claims 2, 3, or 4, wherein:
said output terminal is operably coupled directly to a potential substantially equal to a ground and provides an output current.

6. The circuit of claims 2, 3, or 4, wherein:
said output terminal is operably coupled to a potential substantially equal to a ground through a substantially linear resistive load, and provides an output current and voltage.

7. The circuit of claims 2, 3, or 4, wherein:
said output terminal is operably coupled to a high impedance point and provides an output voltage.

8. A four quadrant multiplier circuit for providing an output which is proportional to a multiplication product of input voltages $V_1$ and $V_2$, comprising:

a first transistor pair, comprising:
an n-channel field effect transistor having a first gate, first and second terminals, a threshold voltage $V_{tn}$, and a gain constant $K_n$; and
a p-channel field-effect transistor having a second gate, third and fourth terminals, a threshold voltage $V_{tp}$, where $V_{tp}$-$V_{tn}>0$, and gain constant $K_p$; where
said input voltage $V_2$ is applied to said first terminal and an input voltage $-V_2$ is applied to said fourth terminal, such that
when said input $V_2>0$ said second and third terminals are sources of said n- and p-channel transistors, and said first and fourth terminals are drains of said n- and p-channel transistors, and
when said input $V_2<0$, said second and third terminals are drains of said n- and p-channel transistors, and said first and fourth terminals are sources of said n- and p-channel transistors; and said first and second gates are electrically coupled in common to form a common gate, said common gate receiving a voltage which is the sum of said input voltage $V_1$ and a bias voltage $V_b'$ which is restricted such that $V_{tn}<V_b'<V_{tp}$; and a second transistor pair, comprising:
an n-channel field effect transistor having a first gate, first and second terminals, a threshold voltage substantially equal to $V_{tn}$, and a gain constant substantially equal to $K_n$; and
a p-channel field-effect transistor having a second gate, third and fourth terminals, a threshold voltage substantially equal to $V_{tp}$, and a gain constant substantially equal to $K_p$; where
said input voltage $V_2$ is applied to said fourth terminal and said input voltage $-V_2$ is applied to said first terminal, such that
when said input $V_2<0$, said second and third terminals are sources of said n- and p-channel transistors, and said first and fourth terminals are drains of said n- and p-channel transistors, and
when said input $V_2 0$, said second and third terminals are drains of said n- and p-channel transistors, and said first and fourth terminals are sources of said n- and p-channel transistors;

said first and second gates are electrically coupled in common to form a common gate, said common gate receiving a voltage which is the sum of an input voltage $-V_1$ and said bias voltage $V_b'$; where said second and third terminals of said first transistor pair and said second and third terminals of said second transistor pair are electrically coupled together to provide an output terminal; and $|V_1|$ and $|V_2|$ are limited such that each of said transistors in said first and second transistor pairs is operated in its respective triode region.

9. The circuit of claim 8 wherein:
said n-channel transistor of said first transistor pair and said n-channel transistor of said second transistor pair are enhancement-mode transistors; and
said p-channel transistor of said first transistor pair and said p-channel transistor of said second transistor pair are depletion-mode transistors.

10. The circuit of claim 8 wherein:
said n-channel transistor of said first transistor pair and said n-channel transistor of said second transistor pair are depletion-mode transistors; and
said p-channel transistor of said first transistor pair and said p-channel transistor of said second transistor pair are enhancement-mode transistors.

11. The circuit of claim 8 wherein:
said n-channel transistor of said first transistor pair and said n-channel transistor of said second transistor pair are depletion-mode transistors; and
said p-channel transistor of said first transistor pair and said p-channel transistor of said second transistor pair are depletion-mode transistors.

12. The circuit of claim 9, 10, or 11 wherein:
said output terminal is operably coupled directly to a potential substantially equal to a ground and provides an output current.

13. The circuit of claims 12, wherein: said bias voltage $V_b'$ is substantially equal to $(V_{tp}+V_{tn})/2$.

14. The circuit of claims 12, wherein:
the absolute value of said gain constant $K_n$ is substantially equal to said gain constant $K_p$.

15. The circuit of claims 9, 10, or 11, wherein:
said output terminal is operably coupled to a potential substantially equal to a ground through a substantially linear resistive load, and provides an output current and voltage.

16. The circuit of claims 15, wherein:
said bias voltage $V_b$ is substantially equal to $(V_{tp}+V_{tn})/2$.

17. The circuit of claims 15, wherein:
the absolute value of said gain constant $K_n$ is substantially equal to said gain constant $K_p$.

18. The circuit of claims 9, 10, or 11, wherein:
said output terminal is operably coupled to a high impedance point and provides an output voltage.

19. The circuit of claims 18, wherein:
said bias voltage $V_b'$ is substantially equal to $(V_{tp}+V_{tn})/2$.

20. The circuit of claims 18, wherein:
the absolute value of said gain constant $K_n$ is substantially equal to said gain constant $K_p$.

* * * * *